United States Patent [19]

Hatada

[11] Patent Number: 4,876,221
[45] Date of Patent: Oct. 24, 1989

[54] BONDING METHOD
[75] Inventor: Kenzo Hatada, Katano, Japan
[73] Assignee: Matsushita Electric Industrial Co., Ltd., Osaka, Japan
[21] Appl. No.: 191,023
[22] Filed: May 3, 1988
[51] Int. Cl.[4] .......................................... H01L 21/60
[52] U.S. Cl. ................................... 437/212; 437/183; 437/247; 228/188
[58] Field of Search ............... 437/183, 209, 212, 213, 437/247; 29/843; 228/180.2, 188, 4.5

[56] References Cited

U.S. PATENT DOCUMENTS

| 4,247,590 | 1/1981 | Hayakawa et al. | 228/180.2 |
| 4,494,688 | 1/1985 | Hatada et al. | 228/180.2 |

FOREIGN PATENT DOCUMENTS

| 000974 | 1/1979 | Japan | 437/209 |
| 025242 | 2/1983 | Japan | 437/183 |
| 015956 | 1/1985 | Japan | 437/183 |
| 0130835 | 7/1985 | Japan | 437/247 |
| 0130837 | 7/1985 | Japan | 437/247 |
| 210649 | 9/1986 | Japan | 437/183 |
| 212034 | 9/1986 | Japan | 437/183 |

Primary Examiner—Brian E. Hearn
Assistant Examiner—Tuan Nguyen
Attorney, Agent, or Firm—Wenderoth, Lind & Ponack

[57] ABSTRACT

Disclosed is a method for bonding one of the principal planes of a lead formed on a film or the like and an electrode formed on the face side of a semiconductor element, by way of metal bumps, wherein the electrode, metal bumps and lead are pressurized between a support for supporting the semiconductor element and a jig placed at the other principal plane side of the lead, and the semiconductor element is heated so that the temperature at the back side of the semiconductor element may be higher than that at the face side of the semiconductor element. According to this method, it is enough to heat the support at the semiconductor element side, and it is not necessary, as required in the prior art, to heat temperature, and the conventional problems such as fusion of lead to the boding tool are solved. Still more, since the bonding tool can be placed at the back side of the semiconductor element and the bonding tool contacts only with the back side of the element, so that fusion of lead to the bonding tool and lowering of thermal conduction to the tool bottom may be also prevented.

2 Claims, 6 Drawing Sheets

BONDING METHOD

BACKGROUND OF THE INVENTION

This invention relates to a method of bonding a lead of film carrier or the like and a semiconductor element.

The method of connection between a film-shaped lead and an aluminum electrode on a semiconductor element by way of a metal bump (so-called film carrier method) is employed as a mounting method suited to thin or small structure. Referring to FIGS. 2A, 2B, the bonding method of film lead and electrode on semiconductor of the conventional film carrier type is described below. By etching an electrode 2 on a semiconductor element 1 and a Cu foil adhered to film 3a of a film carrier 3, they are positioned with an Zn-plated lead 4. At this time, metal bumps 5 may be formed either on the electrode 2 on the semiconductor element 1 by way of a multilayer metal film (barrier metal), or on the lead side by transfer bump method. FIG. 1 shows the formation of metal bump on the lead side by the transfer bump method. The semiconductor element 1 is placed on a state 24, and is pressurized and heated 23 from above the lead 4 on the surface of semiconductor element by a bonding tool 20 having a heater 21. Next, when pressure-heating 23 is removed, if the metal bump 5 is made of Au, the metal bump 5 and the aluminum electrode 2 on the semiconductor element 1 are joined with Au-Al alloy. The temperature of the bonding tool 20 reaches 350° to 550° C.

In such bonding, since the temperature of the bonding tool is relatively high, the bottom of the bonding tool 20 and the lead 4 are fused together when pressurizing and heating as shown in FIG. 2A, and when the tool 20 is taken apart, the lead 4 may be broken as shown in FIG. 2B, and the bond strength of the metal bump 5 and the electrode 2 on the semiconductor element 1 is lowered.

Besides, since the temperature of the tool 20 is high, the Sn 4a used for surface treatment on the lead 4 deposits on the bottom of the bonding tool 20 when bonding, and it is oxidized due to high temperature to form a layer poor in thermal conduction, which impairs the thermal conduction from the bottom of the bonding tool 20 to the lead 4, so that the temperature at the junction of the metal bump 5 and electrode 2 may be unstable. As a result, alloy formation state becomes unstable, and the reliability of the bond strength is lowered.

In another method it is possible to heat the stage 24 to about 150° C. and prevent the lead 4 and electrode 2 from becoming cool when pressurizing the tool 20, but the problems of fusion of tool and lead and deposit of Sn on the tool 20 are not solved.

Incidentally, the transfer bump method was disclosed in U.S. Pat. No. 4,494,688 (Hatata).

SUMMARY OF THE INVENTION

It is hence a primary object of this invention to present a highly reliable bonding method which is free from occurrence of fusion of bonding tool and lead and damage of lead.

It is another object of this invention to obtain a secure bond by supplying a stable temperature in the junction of metal bumps and a semiconductor element.

It is a further object of this invention to obtain a bonding tool with a high degree of freedom without causing contamination of the bottom of bonding tool or extreme wear of the tool.

These and other objects are accomplished by the present invention relating to a bonding method of one of the principal planes of a lead formed on a film or the like and an electrode formed on the substrate surface of a semiconductor element by way of metal bumps, wherein said electrode, said metal bumps and lead are pressurized between a support for supporting said semiconductor substrate and a jig placed at the side of the other principal plane of said lead, and the semiconductor element substrate is heated to raise the temperature of the semiconductor element substrate back side higher than the electrode temperature on the face side of the semiconductor element substrate.

According to the present invention as described herein, the following benefits, among others, are obtained.

That is, in this invention, it is enough to heat the support at the semiconductor element substrate side, and it is not necessary, as required in the prior art, to heat the bonding tool used for pressurizing the lead, so that the problem of fusion of lead to the bonding tool is avoided. Besides, since the bonding tool can be placed at the back side of the semiconductor element and the bonding tool contacts only with the back side of the element, fusion of lead on the bonding tool and lowering of thermal conduction to the bottom of the tool may be prevented.

While the novel features of the invention are set forth in the appended claims, the invention, both as to organization and content, will be better understood and appreciated along with the other objects and features thereof, from the following detailed description taken on conjunction with the drawings.

DETAILED DESCRIPTION OF THE INVENTION

Figure 1:
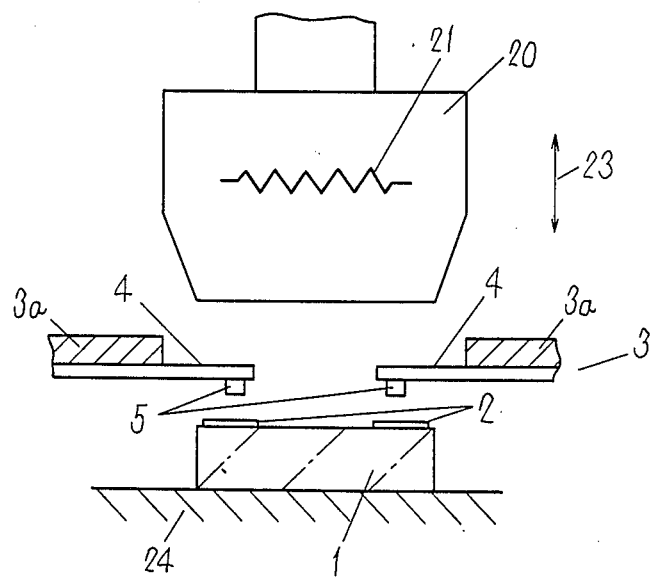
FIGS. 1, 2A, and 2B show the conventional bonding method.
Figure 2A:
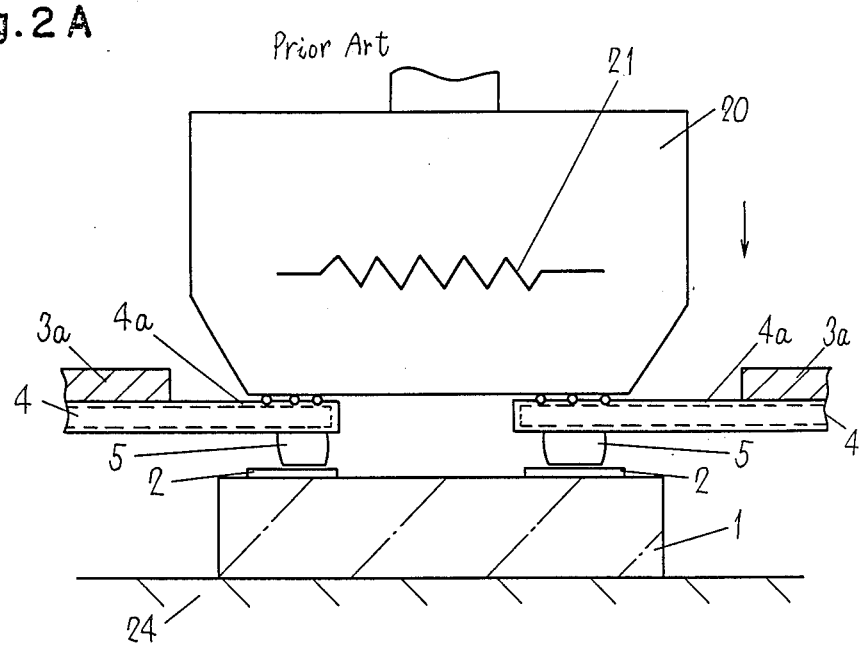
Figure 2B:
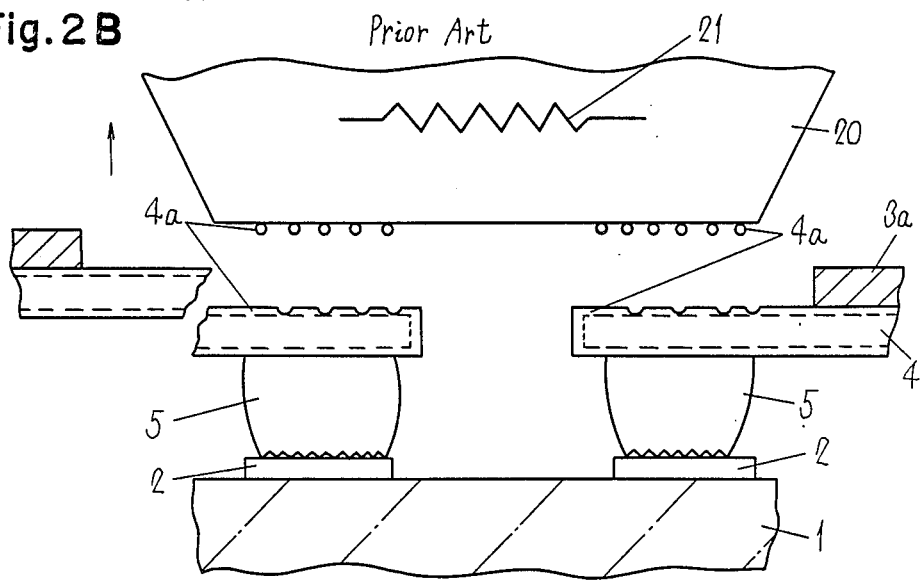
Figure 3:
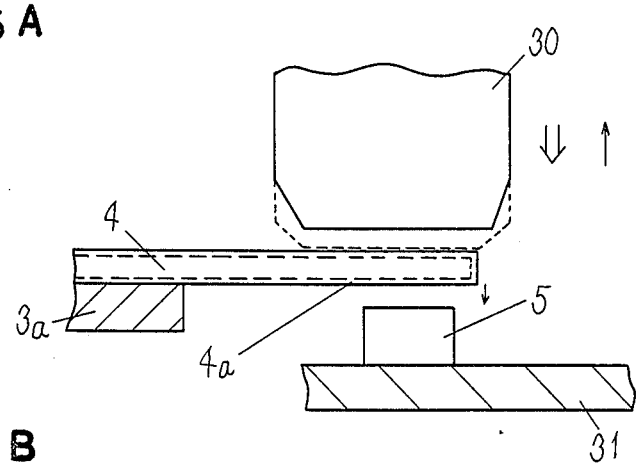
FIGS. 3A to 3C show a bump forming method on the lead by transfer bump method.
Figure 3:
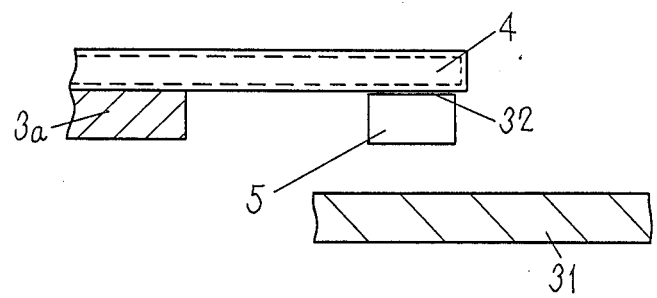
Figure 3:
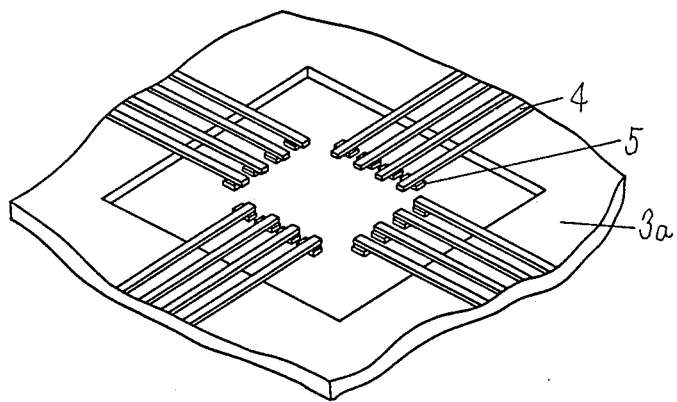

FIG. 3 shows a method of forming a film carrier lead possessing metal bumps for use in this invention by transfer bump process. Multiple metal bumps 5 (only one shown in the drawing) are selectively formed on a glass substrate 31 by electroplating or other method, and plural leads 4 adhered to a film 3a are positioned, and a tool 30 is lowered to pressurize and heat the leads 4 and bumps 5 (FIG. 3A), thereby joining the leads 4 and bumps 5 by forming a eutectic alloy of Sn-An by Sn 4a and bumps 5. When the tool 30 is lifted, the leads 4 and bumps 5 joined at a junction 32 are separated as the bumps 5 are departed from the substrate 31 by the elastic force of the leads 4, so that leads 4 with bumps 5 are obtained. FIG. 3C shows thus obtained film carrier leads with bumps. For details, see, U.S. Pat. No. 4,494,688 (Hatada).

Figure 4:
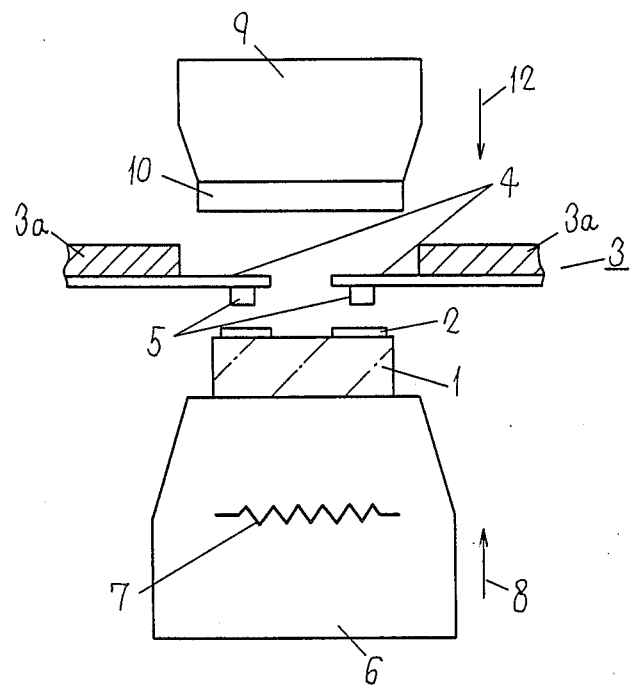
FIGS. 4 and 5 show a bonding method according to an embodiment of this invention.

The film carrier with bumps 5 formed in this way is installed in the state as shown in FIG. 4. In this drawing, the bonding tool 6 is positioned at the back side of the semiconductor element 1. The element 1 is often a large scale integration (LSI) of silicon or the like at high density, but it is not limitative.

That is, the back side of the semiconductor element 1 is placed on the bonding tool 6 for pressurizing and heating. On the other hand, above the lead 4, a jig 9 having a heatproof glass 10 is disposed at a position confronting the semiconductor element 1. The temperature of the jig 9 contacting with the lead 4 at the face side of the semiconductor element 1 is somewhat low ranging from the ordinary temperature to about 250° C., while the temperature of the bonding tool 6 contacting with the back side of the semiconductor element 1 is set higher than that of the jig 9, in a range of 350° to 550° C., by the principal heat source for bonding.

In this state, when the bonding tool 6 is raised in the direction of arrow 8 and the jig 9 is lowered in the direction of arrow 12, the metal bumps 5 and the electrode 2, for example of aluminum, of the semiconductor element 1 may be joined. That is, the heat of the heater 7 of the bonding tool 6 is conducted to the semiconductor element 1 to heat the junction between the bumps 5 and the electrode 2. Or, in the structure in FIG. 4, the bonding tool 6 may be fixed, and only the jig 9 having the heatproof glass 10 may be lowered to pressurize. The bonding tool 6 may be either of continuous heating method or of pulse heating method for heating only when bonding, that is, a low temperature is set when not bonding, and voltage and current are instantly applied when bonding to raised to specified high temperature to pressurize and heat. In this method, since the quantity of radiation heat that the film carrier receives from the high temperature of the bonding tool 6 is small, thermal deformation is not formed, and errors in the lead pitch or other defects may be prevented.

Or, as for the pressurizing method by the jigs 6, 9, by setting at least in two steps, when a low pressure is applied in the first step, and a specified high pressure is used in the next step, the jigs 6, 9 contact with the back side of the semiconductor element 1 and the lead 4 at the low pressure in the first step, and the semiconductor element 1 and lead 4 are preliminarily heated at this pressure, and then specified high pressure is applied to pressurize and form an alloy of Au and Al.

As the heatproof insulating material 10 of the jig 9, quartz, heatproof glass or ceramics may be used, and when the heatproof insulating material 10 is heated to a certain temperature by installing a heater in the jig 9, the temperature of the bonding tool 6 may be lowered.

Figure 5:
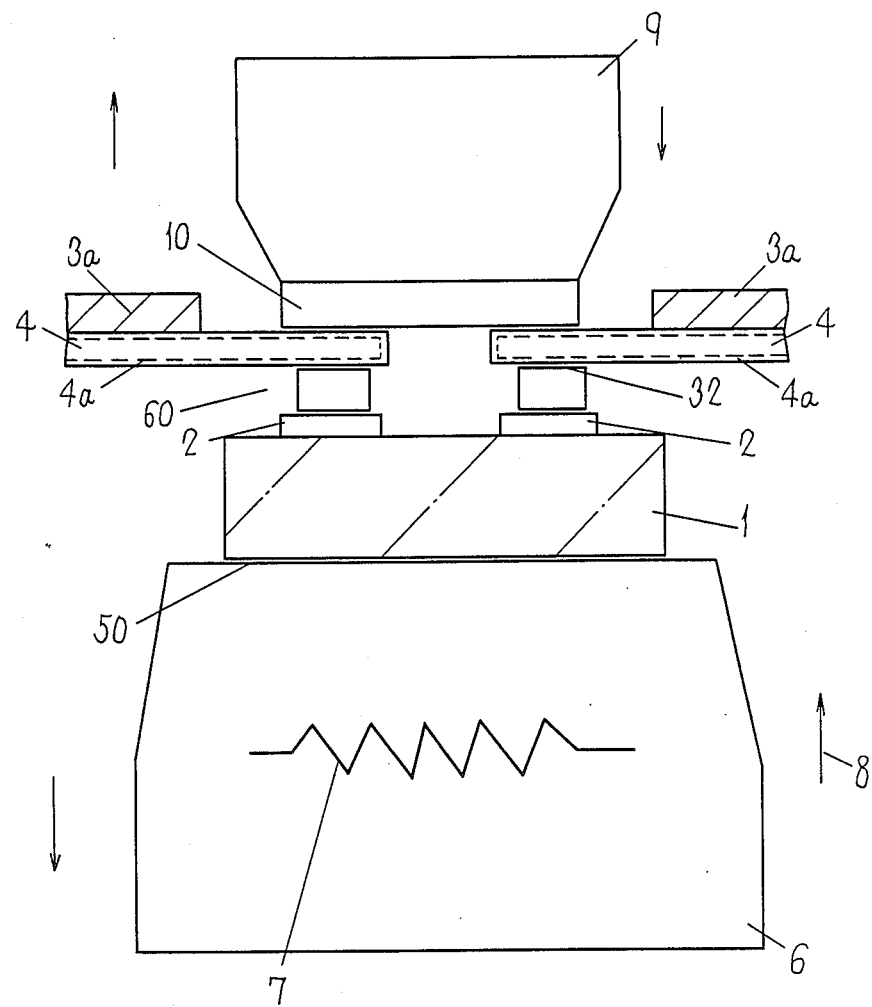
Figure 6:
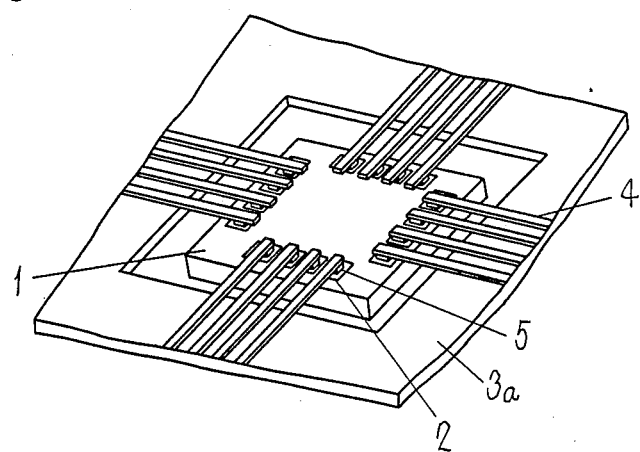
FIG. 6 is a perspective view of a semiconductor element bonded by this invention.

FIG. 5 shows the bonding state according to the bonding method of this invention. In this state, due to heating form the tool 6, the temperature of the back side 50 of the element 1 can be set higher than the temperature at the face side of the semiconductor element 1. Therefore, all the hitherto problems can be solved at once.

A practical example of bonding method of this invention is described below.

In FIG. 5, the back side of a semiconductor element (LSI) 1 possessing an aluminum electrode 2 is placed in a bonding tool 6, and a lead 4 having metal bumps 5 made of Au or the like are placed on the face side of the semiconductor element 1, and a jig 9 is further disposed thereon. The dimensions of the bonding tool 6 are equal to or somewhat larger than the dimensions of the semiconductor element 1, while the jig 9 is almost identical with the semiconductor element 1 in size.

The electrode 2 of the semiconductor element 1 placed on the bonding tool 6 is positioned with the metal bumps 5 on the lead 4. At this time, the temperature of the jig 9 is set in a range of 100° to 250° C., and the bonding tool 6 is set at 350° to 550° C., and when positioning is over, either one or both of the jig 9 and bonding tool 6 move up and down to pressurize and heat the semiconductor element 1 and lead 4. The pressure at this time is about 30 to 120 g/lead, though variable depending on the dimensions of the lead and metal bumps. As a result, the metal bumps 5 and the electrode 2 on the semiconductor element 1 are bonded together.

At this time, since the temperature of the jig 9 contacting with the lead 4 is low and heatproof insulating material such as glass is used, the problem of lowering of strength of junction due to fusion of the lead 4 on the jig 9 is avoided.

Furthermore, as the pressurizing and heating method, when the pressure is set in at least two steps and first the jig 9 and bonding tool 9 contact with the semiconductor element 1 and lead 4 at low pressure, the semiconductor element and lead are preliminarily heated. In the next step, the specified high pressure is applied. In this method, since the semiconductor element can be pressurized preliminarily at a certain temperature, a stable, highly reliable bond is realized. After bonding, the tool 6 is lowered or the jig 9 is raised.

Besides, when the temperature of the bonding tool 6 is first set at low temperature of about 100° to 250° C., nearly equal to the temperature of the jig 9, and then raised to the specified high temperature when pressurizing, it is possible to avoid troubles such as pitch errors in the multiple leads 4 due to thermal deformation of the film carrier 3 by the effect of radiation heat of the bonding tool 6.

Figure 7:
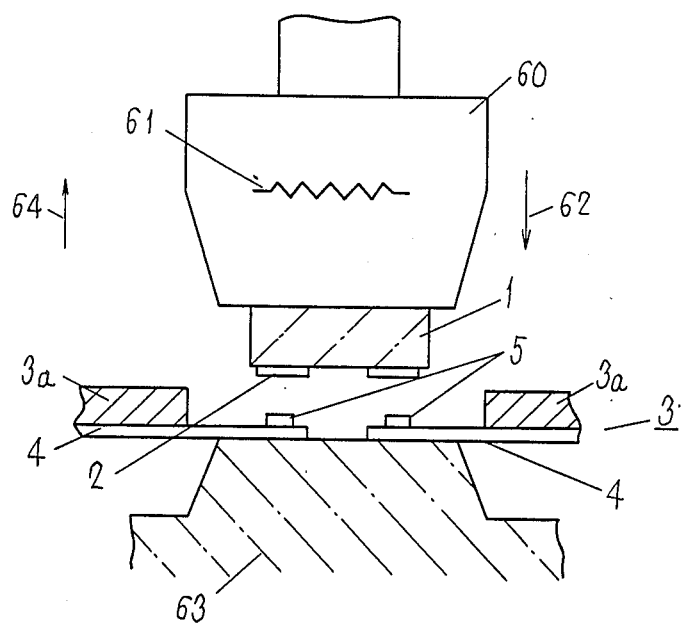
FIG. 7 shows a bonding method according to a different embodiment of this invention.

FIG. 7 shows a bonded semiconductor element.

Another embodiment is described below while referring to FIG. 7. When bonding, the lead 4 of the film carrier 3 is placed on the jig 63 made of heatproof insulating material such as heatproof glass and ceramics, and the semiconductor element 1 is supported on its back side by the bonding tool 60 for pressurizing and heating. When positioning of the metal bumps on the lead 4 and electrode of the semiconductor 1 is over, the bonding tool 60 is lowered as indicated by arrow 62 to perform bonding. After bonding, the tool 60 is raised as indicated by arrow 64.

In the embodiments shown in FIGS. 4 and 7, the metal bumps are formed on the lead 4 by transfer bump method, but it is also possible to form metal bumps on the electrode 2 of the semiconductor element by way of multilayer metal film. In this case, the lead 4 and the bumps 5 on the electrode 2 of the element 1 are bonded by the method of this invention. At this time, too, the high-temperature bonding tool will not directly contact with the leads.

The following effects, among others, are obtained by such embodiments as described above.

1. Because of heating from the back side of the semiconductor element without direct contact between the bonding tool and lead, neither fusion of bonding tool and lead nor damage of lead occurs, so that the reliability of the junction is notably improved.

2. Since Sn and other contamination from the lead do not deposit on the high-temperature bonding tool, a stable temperature can be supplied from the junction, and cleaning process for removing contamination from the bottom of the bonding tool is not needed, and the wear of bonding tool is extremely small.

3. In the conventional method of pressurizing and heating the leads from the film carrier opening, the dimensions of bonding tool somewhat depended on the opening size. In this method, by contrast, since it is designed to heat and pressurize from the back side of the semiconductor element, the bonding tool can be designed freely in its shape and dimensions, so that a bonding tool with a stable temperature distribution may be obtained, and a stable and highly reliable bond is obtained.

4. As the material for bonding tool, conventionally, diamond or other expensive materials were needed. In this invention, since there is no problem of fusion or the like, ordinary steel materials may be used, and the cost of the bonding tool may be notably lowered.

5. Since the film carrier tape is not directly exposed to the high-temperature bonding tool, deflection of film carrier tape and deviation of lead pitch due to heat will not occur.

6. Furthermore, by placing quartz or heatproof glass at the lead side when bonding, the heat applied from the back side of the semiconductor element is confined within the quartz or heatproof glass contacting with said lead and becomes higher than the temperature at the back side of the semiconductor element, so that the temperature of the bonding tool can be lowered by that portion, and it is possible to protect the semiconductor element from heat without having to apply an excessive temperature to the semiconductor element.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

I claim:

1. A method for bonding one of the principal opposite faces of a flat connecting lead to an electrode on one of the principal opposite surfaces of a semiconductor element by means of a metal bump already bonded to said one principal face of the lead or to said electrode, comprising:

supporting the opposite principal surface of the semiconductor element on a supporting tool which is capable of heating the semiconductor element;

positioning the flat connecting lead with the one principal opposite face opposed to the electrode on the semiconductor element with the metal bump therebetween;

providing a jig having a lead engaging face thereon and having at least the lead engaging face of a heat resistant heat insulating material which is other than a material which will alloy with the material of the connecting lead;

positioning said lead engaging face opposite the other of the principal opposite face of the connecting lead;

moving said jig and said supporting tool toward each other to bring the lead engaging face of the jig into contact with the other of the principal opposite face of the connecting lead and to press the metal bump into pressure contact between the electrode and the semiconductor element while at the same time heating said supporting tool to a temperature sufficient to heat the opposite principal surface of the semiconductor element to a temperature higher than the one principal opposite surfaces of the semiconductor element for bonding the metal bump to the electrode or the lead.

2. A method as claimed in claim 1 in which the heat resistant material of said jig is a material taken from the group consisting of heat resistant glass and ceramic.

* * * * *